US009324842B2

(12) United States Patent
Zang et al.

(10) Patent No.: US 9,324,842 B2
(45) Date of Patent: Apr. 26, 2016

(54) BURIED LOCAL INTERCONNECT IN FINFET STRUCTURE AND METHOD OF FABRICATING SAME

(71) Applicant: GLOBALFOUNDRIES Inc., Grand Cayman (KY)

(72) Inventors: Hui Zang, Albany, NY (US);
Chun-chen Yeh, Clifton Park, NY (US);
Tenko Yamashita, Schenectady, NY (US); Veeraraghavan Basker, Schenectady, NY (US)

(73) Assignees: GLOBALFOUNDRIES INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 108 days.

(21) Appl. No.: 14/135,716

(22) Filed: Dec. 20, 2013

(65) Prior Publication Data

US 2015/0179766 A1 Jun. 25, 2015

(51) Int. Cl.
*H01L 31/072* (2012.01)
*H01L 29/66* (2006.01)
*H01L 29/78* (2006.01)
*H01L 21/306* (2006.01)
*H01L 29/417* (2006.01)

(52) U.S. Cl.
CPC .... *H01L 29/66795* (2013.01); *H01L 21/30604* (2013.01); *H01L 29/41791* (2013.01); *H01L 29/785* (2013.01)

(58) Field of Classification Search
CPC ........... H01L 2224/16227; H01L 2224/81192; H01L 23/49827; H01L 24/03; H01L 24/81
USPC ............................ 257/347, 192; 438/149, 157
See application file for complete search history.

(56) References Cited

U.S. PATENT DOCUMENTS

| 6,054,385 A | 4/2000 | Gardner et al. | |
|---|---|---|---|
| 8,900,951 B1 * | 12/2014 | Cheng | H01L 29/0673 257/E21.453 |
| 2004/0262692 A1 * | 12/2004 | Hareland | H01L 29/1054 257/369 |
| 2006/0138553 A1 * | 6/2006 | Brask | H01L 21/845 257/369 |
| 2007/0210355 A1 * | 9/2007 | Izumida | H01L 29/6659 257/288 |
| 2011/0147840 A1 * | 6/2011 | Cea | H01L 29/41791 257/347 |
| 2011/0193141 A1 * | 8/2011 | Lin | H01L 29/045 257/255 |

OTHER PUBLICATIONS

R. W. Mann et al. "Silicides and Local Interconnections for High-Performance VLSI Applications", IBM J. Res. Develop. vol. 39 No. 4 Jul. 4, 1995, pp. 403-417.

* cited by examiner

*Primary Examiner* — Andy Huynh
(74) *Attorney, Agent, or Firm* — Ditthavong & Steiner, P.C.

(57) ABSTRACT

A method for fabricating a finfet with a buried local interconnect and the resulting device are disclosed. Embodiments include forming a silicon fin on a BOX layer, forming a gate electrode perpendicular to the silicon fin over a portion of the silicon fin, forming a spacer on each of opposite sides of the gate electrode, forming source/drain regions on the silicon fin at opposite sides of the gate electrode, recessing the BOX layer, undercutting the silicon fin and source/drain regions, at opposite sides of the gate electrode, and forming a local interconnect on a recessed portion of the BOX layer.

20 Claims, 11 Drawing Sheets

BURIED LOCAL INTERCONNECT IN FINFET STRUCTURE AND METHOD OF FABRICATING SAME

TECHNICAL FIELD

The present disclosure relates to local interconnects in semiconductor devices, and more particularly to local interconnects in finfet structures.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of lightly doped drain structures, multiple implants for source/drain regions, silicidation of gates and source/drains, and multiple sidewall spacers, for example. Conductors are routed over dielectric layers to connect to source/drain junctions and gates. The entire process of routing and making connections is generally termed "metalization".

As the complexity of metallization has increased, multiple layers of interconnect structures as well as short distance interconnects, or local interconnects, at levels at or below the customary metallization layers have been employed. Local interconnects are a special form of interconnects for very short distances, such as between the gate and drain of an individual semiconductor device.

In finfet devices, local interconnects are conventionally formed over the fins, as illustrated in FIG. 1. As shown, one or more fins 101 (two shown) are formed on substrate 103, with a gate electrode 105, with a spacer 107 on each side, formed perpendicular to and over the fins. A local interconnect 109 is also formed over the fins 101, separated from the gate electrode 105. Because of the large exposed source/drain contact area (due to the local interconnect) facing the gate in the width direction, the density of field lines from the gate is increased, which in turn increases the parasitic capacitance between the gate and the contact.

A need therefore exists for methodology enabling formation of local interconnects with a reduced parasitic capacitance between the gate and source/drain contacts and the resulting device.

SUMMARY

An aspect of the present disclosure is a method of fabricating a buried local interconnect in a finfet structure.

Another aspect of the present disclosure is a buried local interconnect in a finfet structure.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a silicon fin on a BOX layer; forming a gate electrode perpendicular to the silicon fin over a portion of the silicon fin; forming a spacer on each of opposite sides of the gate electrode; forming source/drain regions on the silicon fin at opposite sides of the gate electrode; recessing the BOX layer, undercutting the silicon fin and source/drain regions, at opposite sides of the gate electrode; and forming a local interconnect on a recessed portion of the BOX layer.

Aspects of the present disclosure include forming a second spacer on each first spacer; and forming a silicide on the source/drain regions. Other aspects include depositing tungsten on each side of the gate electrode up to a height of the silicon fin. Another aspect includes forming a via (V0) on the tungsten. Further aspects include forming the source/drain regions by epitaxially growing doped silicon germanium (SiGe) around the silicon fin. Additional aspects include forming at least one second silicon fin; and merging the fins by the epitaxially growing SiGe around the silicon fins. Other aspects include: forming at least one second silicon fin; and forming un-merged fins by the epitaxially growing SiGe around the silicon fins. A further aspect includes recessing the BOX layer by a dry etch and a wet etch. Additional aspects include the dry etch including dry etching with tetrafluoromethane ($CF_4$) plus oxygen ($O_2$), and the wet etch including wet etching with hydrogen fluoride (HF) or buffered HF. An additional aspect includes recessing the BOX layer 20 to 30 nanometers (nm).

Another aspect of the present disclosure is a device including: a silicon fin on a BOX layer; a gate electrode perpendicular to the silicon fin over a portion of the silicon fin; a spacer on each of opposite sides of the gate electrode; source/drain regions on the silicon fin at opposite sides of the gate electrode, wherein the BOX layer is recessed, undercutting the silicon fin and source/drain regions, at opposite sides of the gate electrode; and a local interconnect on a recessed portion of the BOX layer.

Aspects include: a second spacer on each first spacer; and a silicide on the source/drain regions. Other aspects include tungsten on each side of the gate electrode up to a height of the silicon fin. Further aspects include a via (V0) on the tungsten. Another aspect includes the source/drain regions including doped silicon germanium (SiGe) epitaxially grown on exposed surfaces of the silicon fin. Additional aspects include: at least one second silicon fin, wherein the epitaxially grown SiGe forms merged fins. Other aspects include: at least one second silicon fin, wherein the epitaxially grown SiGe forms un-merged fins. Another aspect includes the BOX layer being recessed 20 to 30 nanometers (nm).

Another aspect of the present disclosure is a method including: forming one or more silicon fins on a BOX layer; forming a gate electrode perpendicular to the one or more silicon fins over a portion of each of the one or more silicon fins; forming a spacer on each of opposite sides of the gate electrode; forming source/drain regions on each of the one or more silicon fins at opposite sides of the gate electrode by epitaxially growing doped silicon germanium (SiGe) around each of the one or more silicon fins; recessing the BOX layer 20 to 30 nanometers (nm) by a dry etch and a wet etch, undercutting each of the one or more silicon fins and source/drain regions, at opposite sides of the gate electrode; forming a second spacer on each first spacer; forming a silicide on the source/drain regions; forming a local interconnect on a recessed portion of the BOX layer; depositing tungsten on each side of the gate electrode up to a height of the one or more silicon fins; and forming a via (V0) on the tungsten. A further aspect includes the epitaxially grown SiGe forming cladded fins.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A and 2B through 6A and 6B schematically illustrate a process of forming finfets with buried local interconnects, in accordance with an exemplary embodiment. FIGS. 2A through 6A illustrate unmerged fins, and FIGS. 2B through 6B illustrate merged fins.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of increased parasitic capacitance from the gate to source/drain contacts attendant upon employing raised local interconnects in finfet devices. In accordance with embodiments of the present disclosure, local interconnects are buried under the fins by recessing an epi-merged source/drain area to create a cavity for filling with tungsten (W). The buried local interconnects reduce the exposed contact area facing the gate, which in turn reduces the density of field lines from the gate.

Methodology in accordance with embodiments of the present disclosure includes forming a silicon fin on a BOX layer, forming a gate electrode perpendicular to the silicon fin over a portion of the silicon fin, with a spacer on each of opposite sides of the gate electrode, and forming source/drain regions on the silicon fin at opposite sides of the gate electrode. Then the BOX layer is recessed, undercutting the silicon fin and source/drain regions, at opposite sides of the gate electrode, and a local interconnect is formed on a recessed portion of the BOX layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
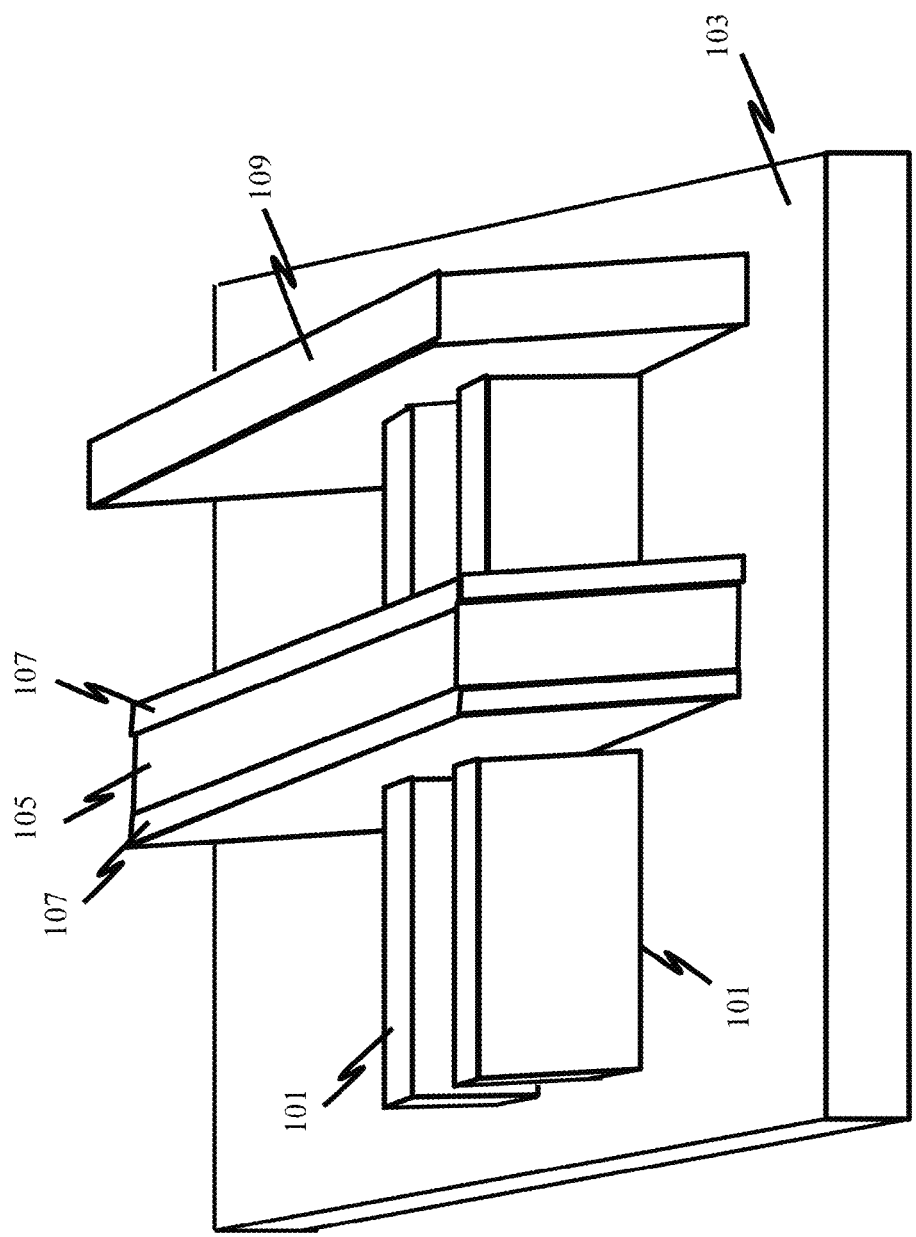
FIG. 1 schematically illustrates a conventional finfet with a raised local interconnect.
Figure 2A:
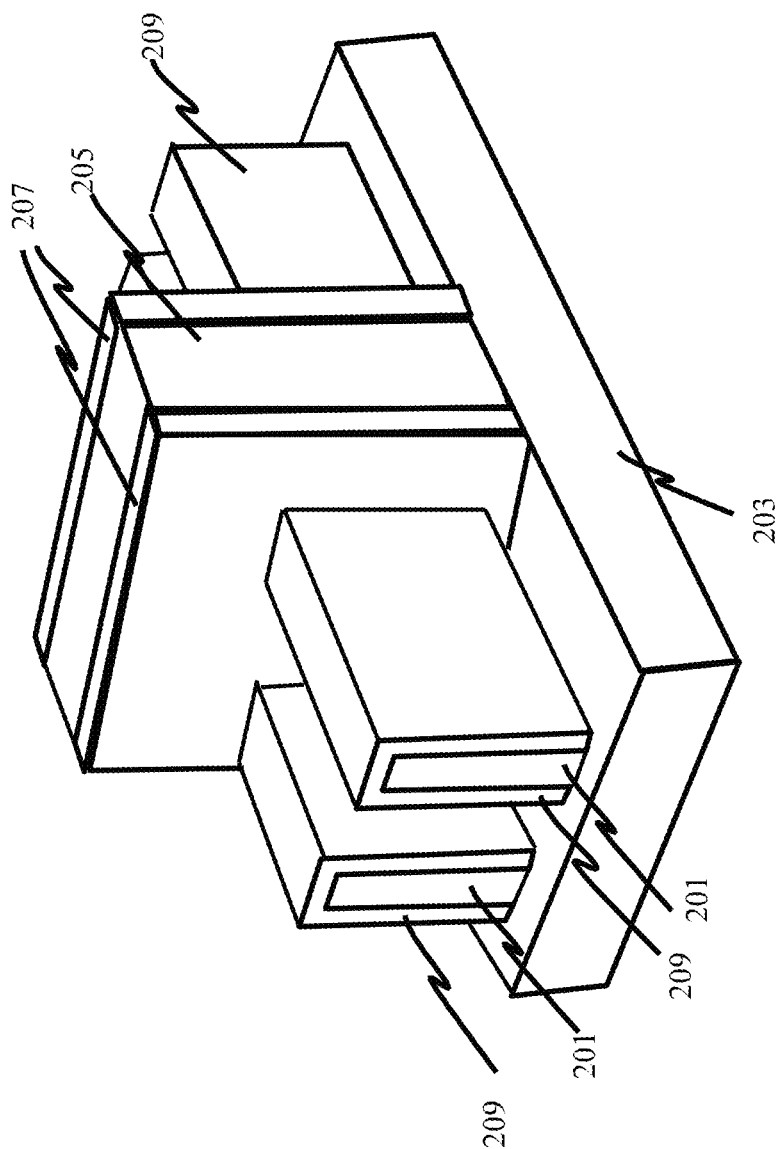
Figure 2B:
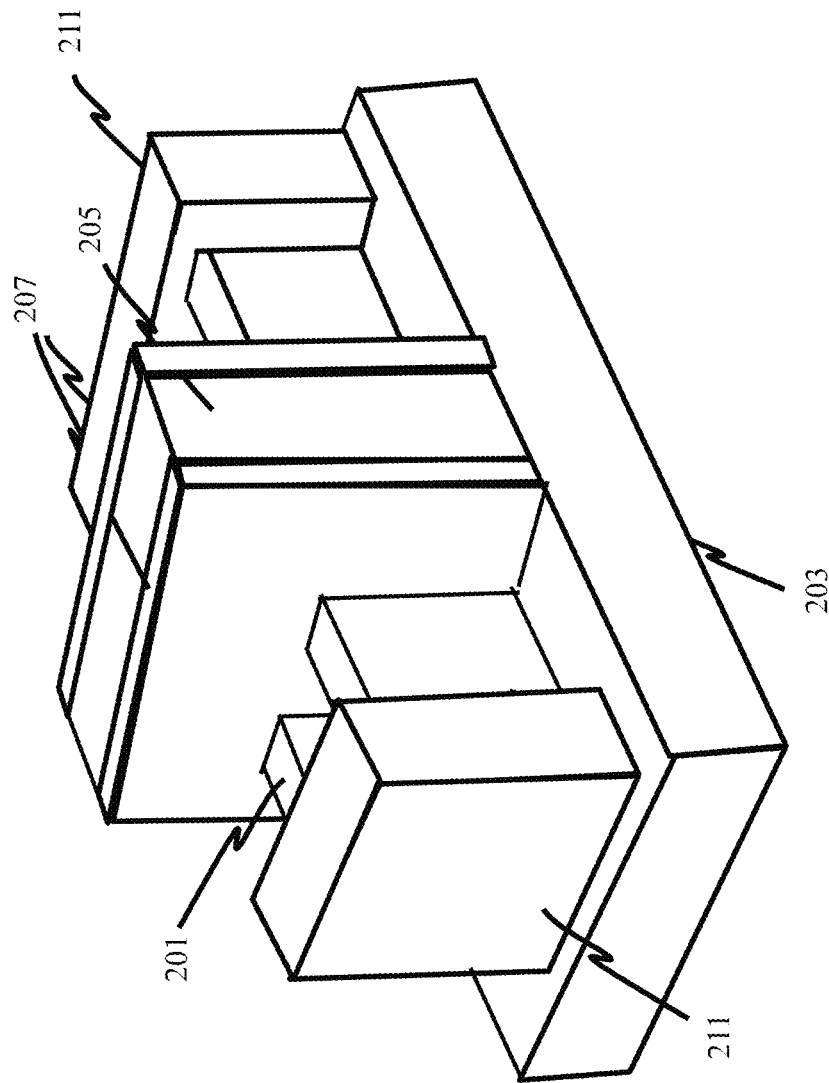

Adverting to FIGS. 2A and 2B through 6A and 6B, a process of forming finfets with buried local interconnects is illustrated, in accordance with an exemplary embodiment. As illustrated in FIG. 2A, the process begins the same as a standard finfet flow. Specifically, one or more silicon fins 201 are formed on a BOX layer 203 of a silicon-on-insulator (SOI) substrate. Two fins are shown, but a single fin or more than two fins may be employed. A gate dielectric, such as silicon oxide (not shown for illustrative convenience), and gate electrode 205, such as a polysilicon dummy gate, are formed over the fins 201. The gate electrode is perpendicular to the fins and is insulated from the fins by the gate dielectric. Offset spacers 207, for example of silicon nitride (SiN) or silicon dioxide ($SiO_2$), are formed on each side of the gate electrode. The silicon is doped, and then cladded fins are formed. More specifically, silicon germanium (SiGe) 209 is epitaxially grown, wrapping around the fins, for source/drain formation. Alternatively, the epitaxial growth may form merged fins, as shown in FIG. 2B. As illustrated, SiGe 211 is grown over and connecting fins 201.

Figure 3A:
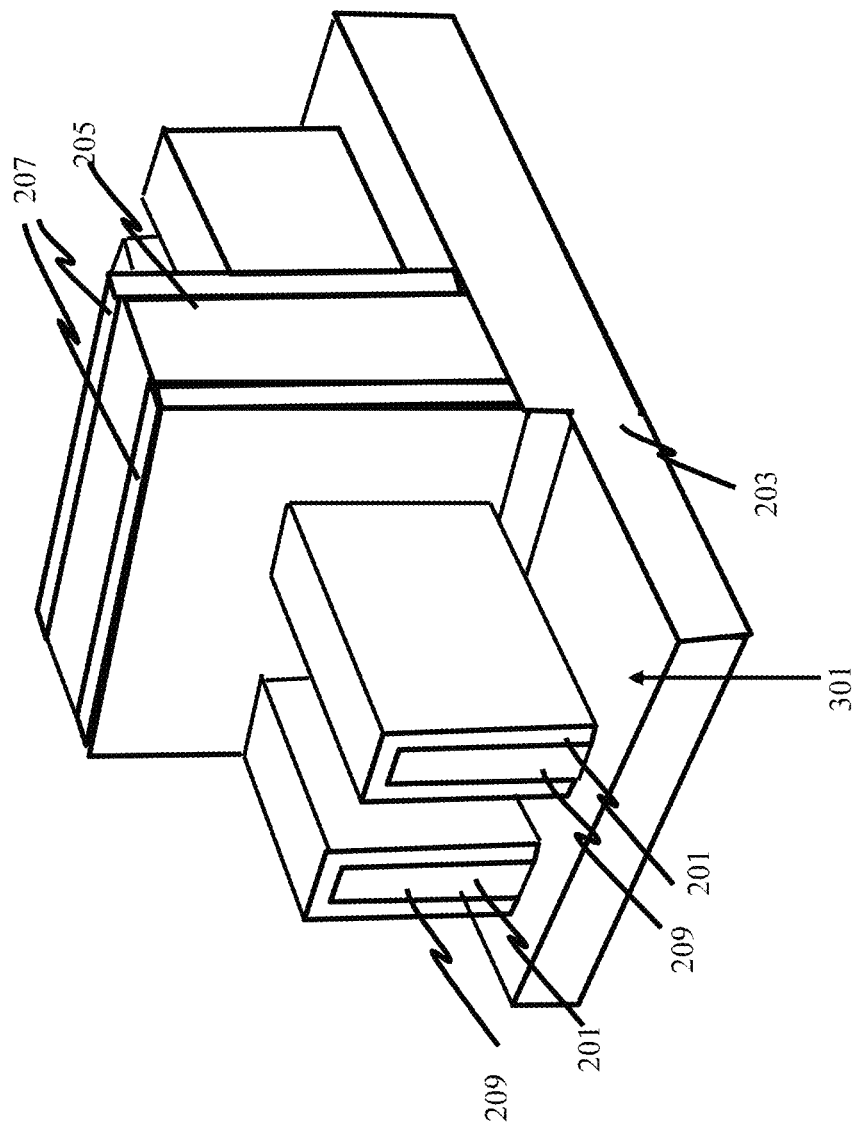
Figure 3B:
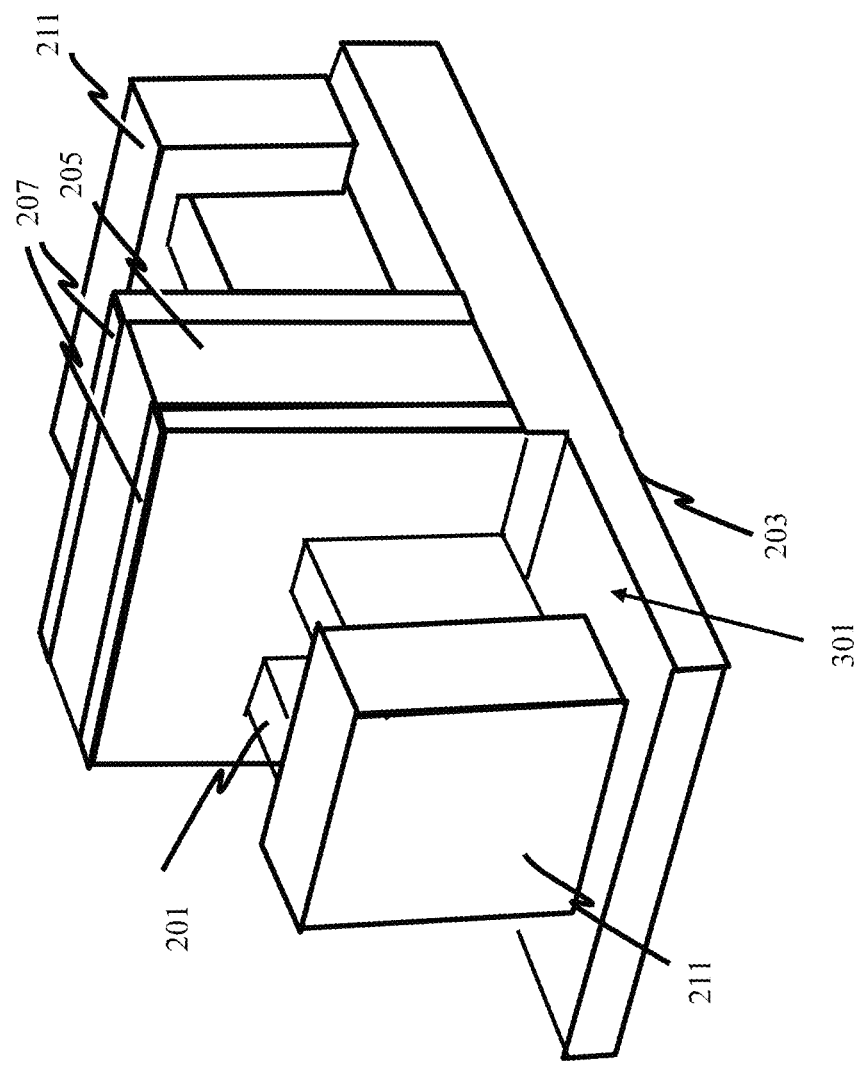

Prior to a silicon/SiGe extension drive-in step, BOX layer 203 is recessed, completely undercutting the bottoms of fins 201, as illustrated at 301 in FIGS. 3A and 3B. BOX layer 203 may be recessed, for example, by a dry etch, such as tetrafluoromethane ($CF_4$) plus oxygen ($O_2$), and a wet etch, such as hydrogen fluoride (HF) or buffered HF, to completely undercut the fin bottom. The recess is formed to a depth of 20 to 30 nanometers. Although the recess is shown only on one side of gate 205 in each of FIGS. 3A and 3B (for illustrative convenience), the recess should be on both sides for both the source and the drain.

Figure 4A:
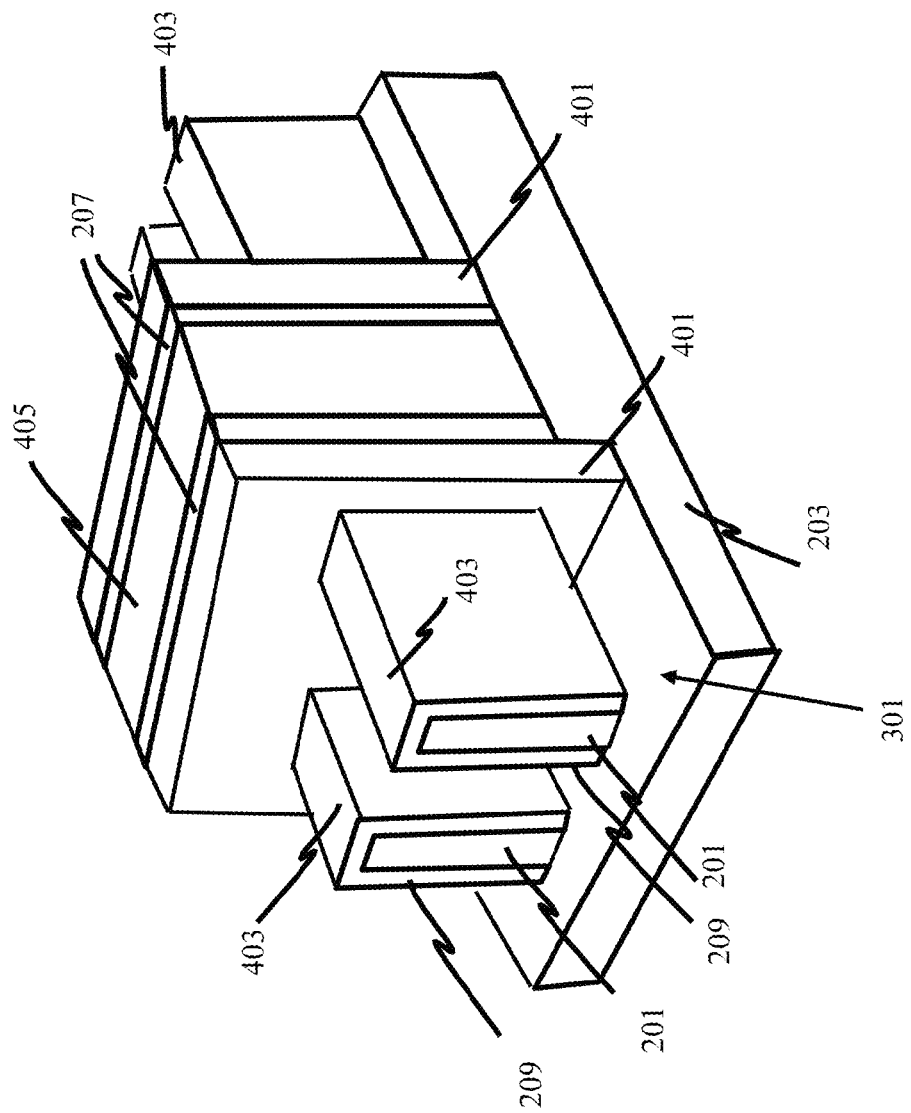
Figure 4B:
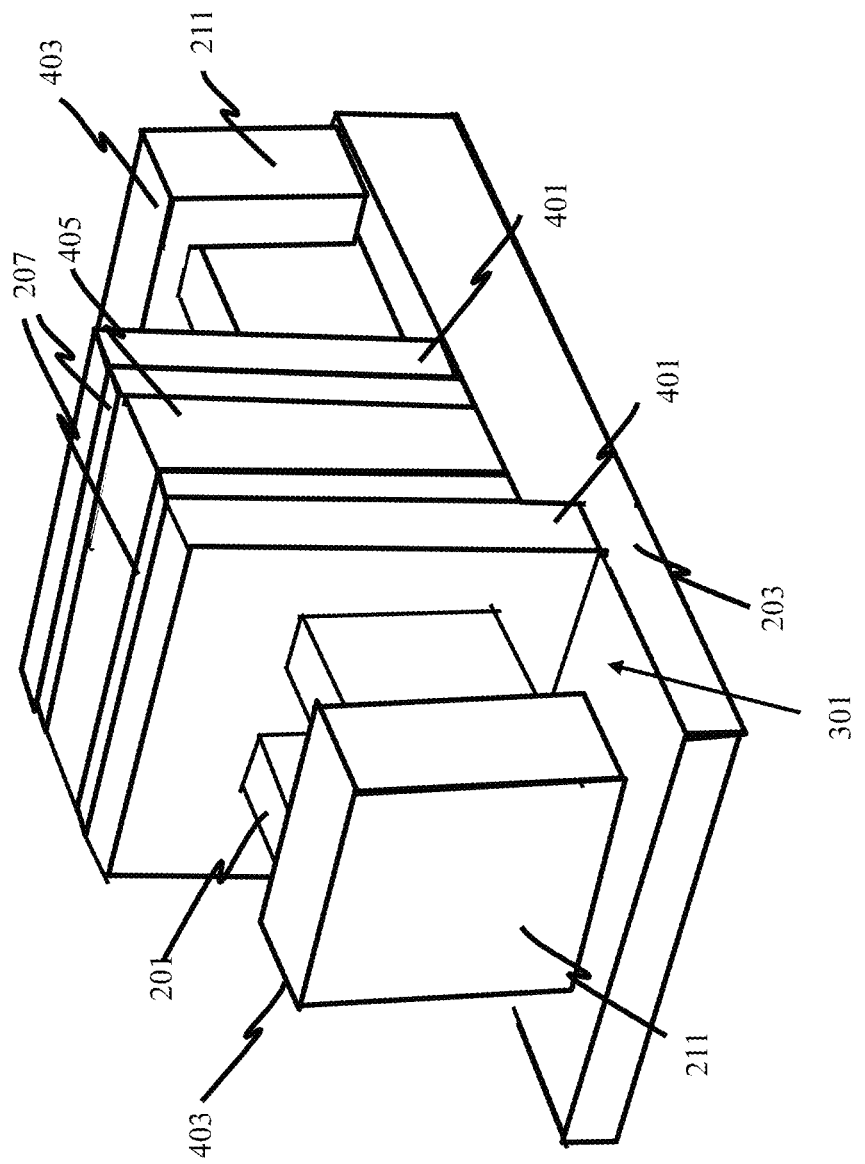

Adverting to FIGS. 4A and 4B, final spacers 401 are formed on opposite sides of gate electrode 205. Source/drain SiGe 209 or 211 is then ion implanted, and a silicide 403 is formed on exposed SiGe surfaces by conventional processes. The gate electrode 205 and gate dielectric may then be replaced with a high-k dielectric (a dielectric having a dielectric constant greater than 3.9) and a metal gate electrode 405. The metal gate may be formed by a preclean followed by formation of a titanium (Ti)/titanium nitride (TiN) liner and W main layer.

Figure 5A:
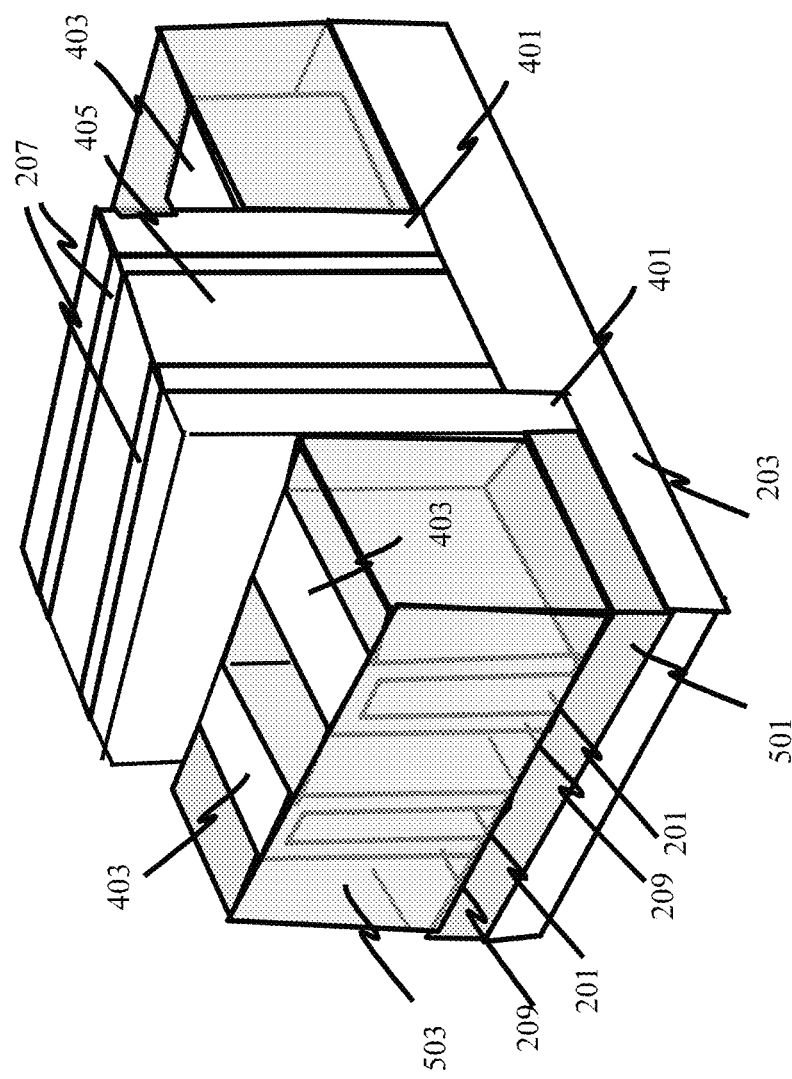
Figure 5B:
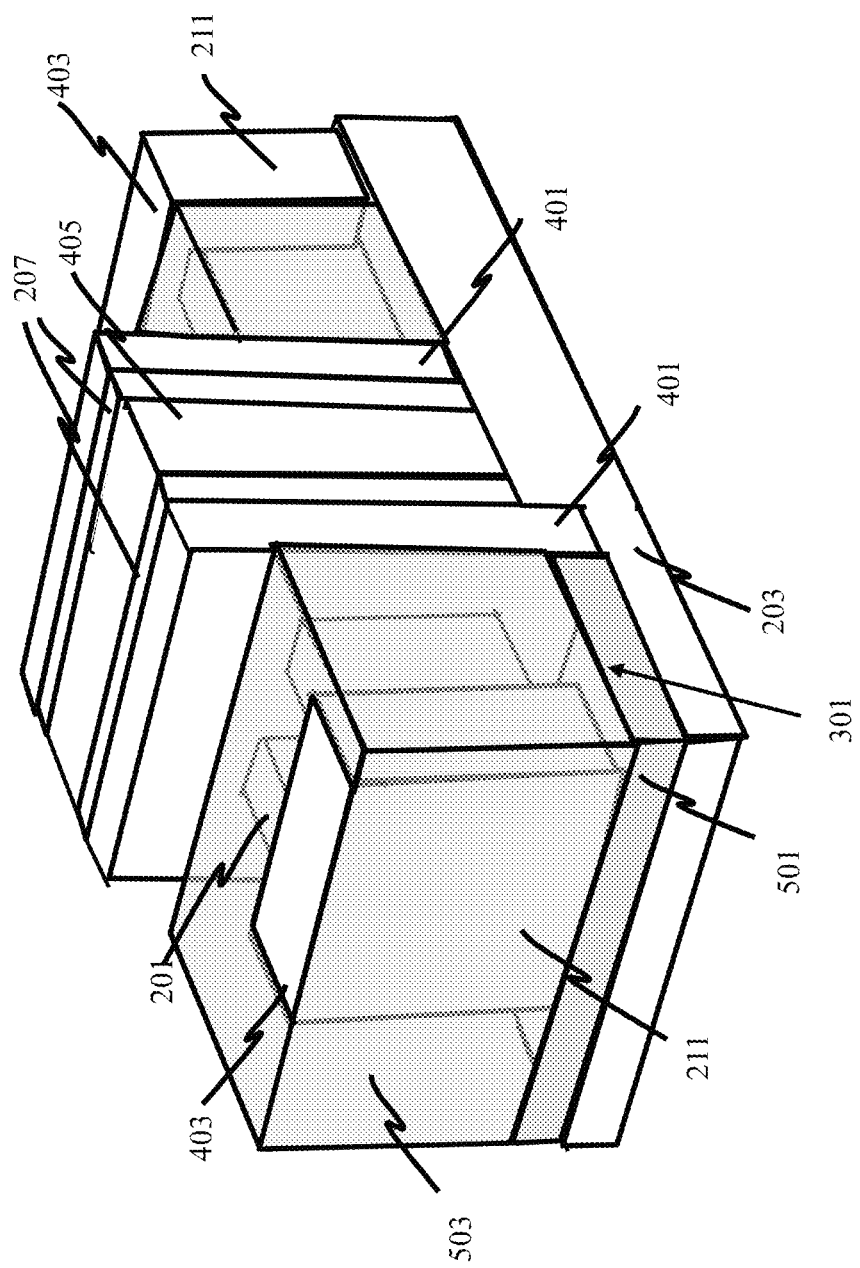

As illustrated in FIGS. 5A and 5B, a buried local interconnect 501 is formed in recess 301. Tungsten (W) 503 is then filled to the height of the fins to reduce the series resistance. Since the local interconnect is buried underneath the fin, gate-to-contact capacitance is virtually eliminated (with the exception of a slight fringing field at the bottom of the fin).

Figure 6A:
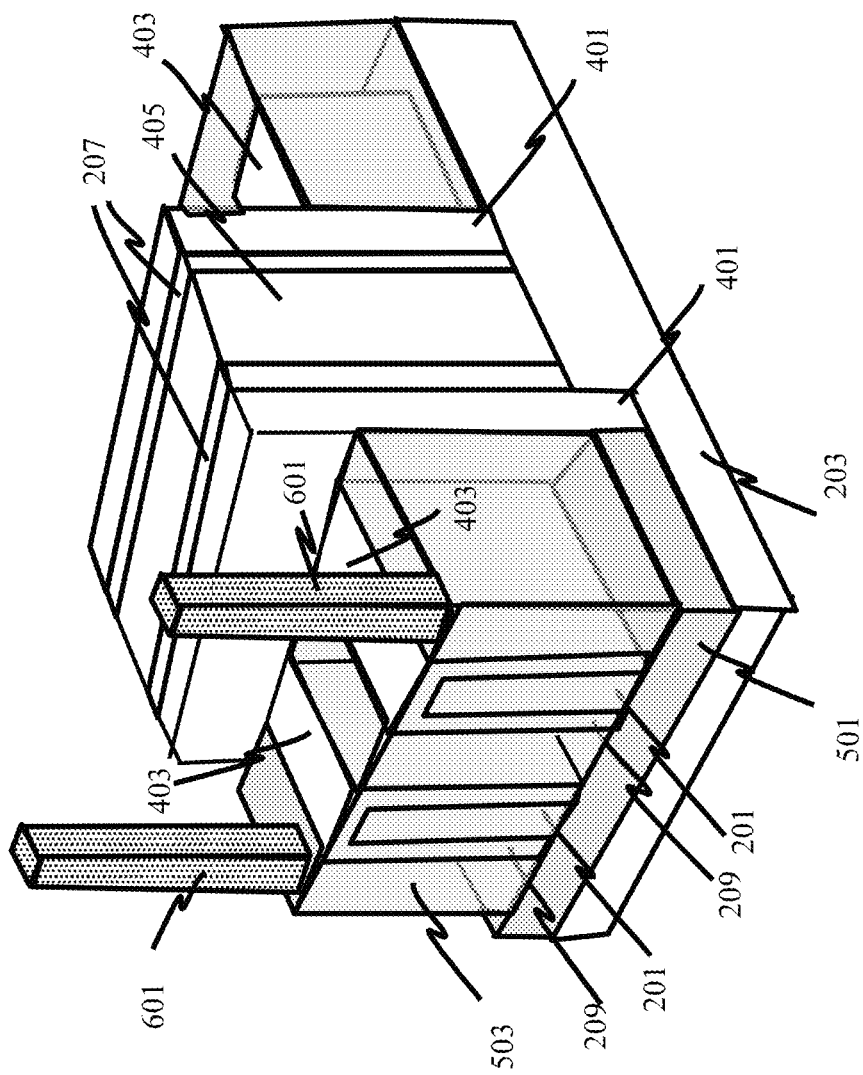
Figure 6B:
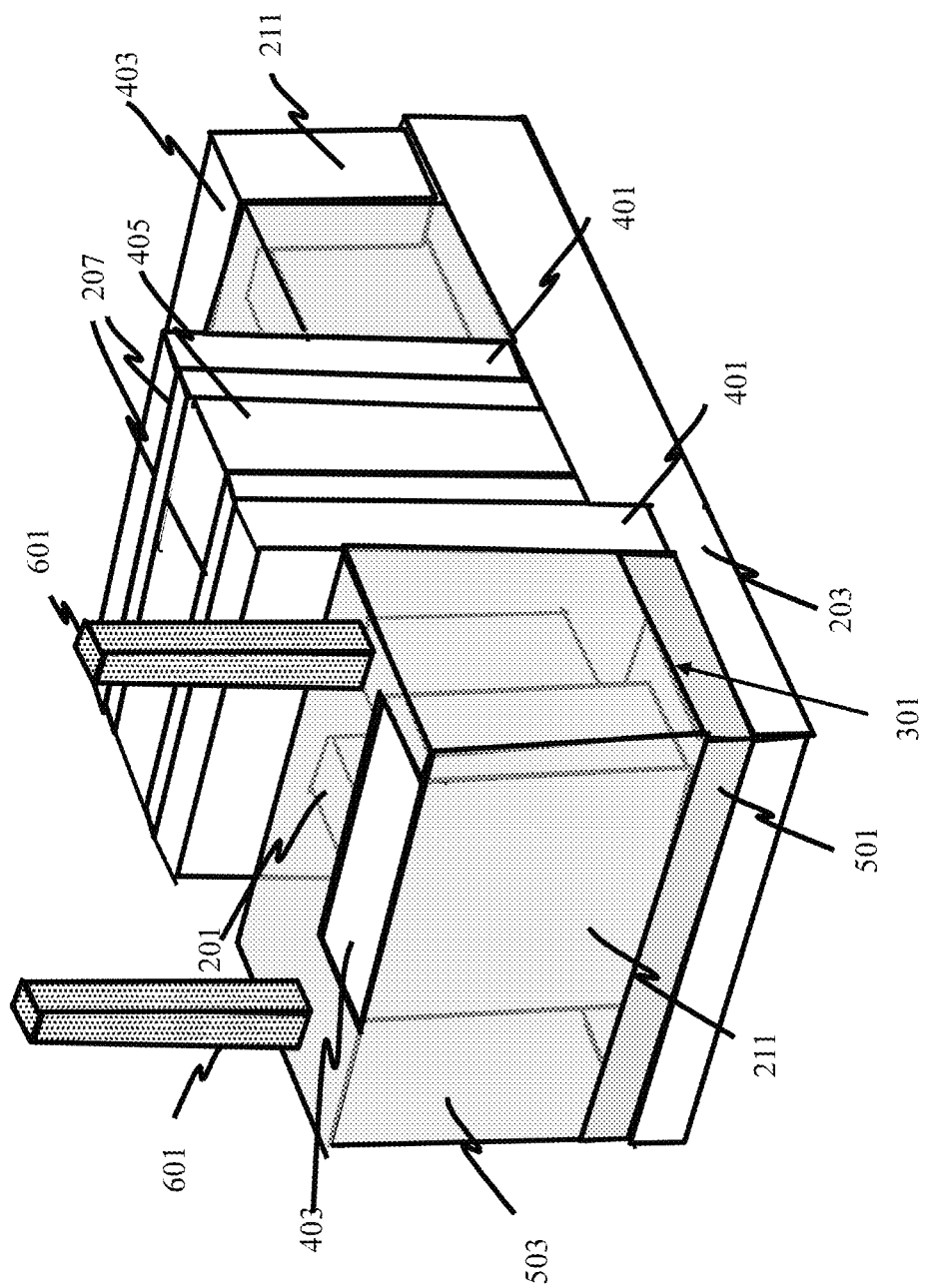

As illustrated in FIGS. 6A and 6B, the final structure may include V0 vias 601 from the tungsten fill 503 to the first metallization layer (M1) (not shown for illustrative convenience. V0's 601 may be filled with aluminum.

The embodiments of the present disclosure can achieve several technical effects, such as a buried local interconnect, which in turn eliminates gate-to-contact capacitance. The present disclosure enjoys utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a silicon fin on a BOX layer;
   forming a gate electrode perpendicular to the silicon fin over a portion of the silicon fin;
   forming a spacer on each of opposite sides of the gate electrode;
   forming source/drain regions on the silicon fin at opposite sides of the gate electrode;
   recessing the BOX layer, undercutting the silicon fin and source/drain regions, at opposite sides of the gate electrode; and
   forming a local interconnect on a recessed portion of the BOX layer.

2. The method according to claim 1, further comprising:
   forming a second spacer on each first spacer; and
   forming a silicide on the source/drain regions.

3. The method according to claim 2, further comprising depositing tungsten on each side of the gate electrode up to a height of the silicon fin.

4. The method according to claim 3, further comprising forming a via (V0) on the tungsten.

5. The method according to claim 1, comprising forming the source/drain regions by epitaxially growing doped silicon germanium (SiGe) around the silicon fin.

6. The method according to claim 5, further comprising:
   forming at least one second silicon fin; and
   merging the fins by the epitaxially growing SiGe around the silicon fins.

7. The method according to claim 5, further comprising:
   forming at least one second silicon fin; and
   forming un-merged fins by the epitaxially growing SiGe around the silicon fins.

8. The method according to claim 1, comprising recessing the BOX layer by a dry etch and a wet etch.

9. The method according to claim 8, wherein the dry etch comprises dry etching with tetrafluoromethane ($CF_4$) plus oxygen ($O_2$), and the wet etch comprises wet etching with hydrogen fluoride (HF) or buffered HF.

10. The method according to claim 1, comprising recessing the BOX layer 20 to 30 nanometers (nm).

11. A device comprising:
    a silicon fin on a BOX layer;
    a gate electrode perpendicular to the silicon fin over a portion of the silicon fin;
    a spacer on each of opposite sides of the gate electrode;
    source/drain regions on the silicon fin at opposite sides of the gate electrode,
    wherein the BOX layer is recessed, undercutting the silicon fin and source/drain regions, at opposite sides of the gate electrode; and
    a local interconnect on a recessed portion of the BOX layer.

12. The device according to claim 11, further comprising:
    a second spacer on each first spacer; and
    a silicide on the source/drain regions.

13. The device according to claim 12, further comprising tungsten on each side of the gate electrode up to a height of the silicon fin.

14. The device according to claim 13, further comprising a via (V0) on the tungsten.

15. The device according to claim 11, wherein the source/drain regions comprise doped silicon germanium (SiGe) epitaxially grown on exposed surfaces of the silicon fin.

16. The device according to claim 11, further comprising:
    at least one second silicon fin,
    wherein the epitaxially grown SiGe forms merged fins.

17. The device according to claim 11, further comprising:
    at least one second silicon fin,
    wherein the epitaxially grown SiGe forms un-merged fins.

18. The device according to claim 11, wherein the BOX layer is recessed 20 to 30 nanometers (nm).

19. A method comprising:
    forming one or more silicon fins on a BOX layer;
    forming a gate electrode perpendicular to the one or more silicon fins over a portion of each of the one or more silicon fins;
    forming a spacer on each of opposite sides of the gate electrode;
    forming source/drain regions on each of the one or more silicon fins at opposite sides of the gate electrode by epitaxially growing doped silicon germanium (SiGe) around each of the one or more silicon fins;
    recessing the BOX layer 20 to 30 nanometers (nm) by a dry etch and a wet etch, undercutting each of the one or more silicon fins and source/drain regions, at opposite sides of the gate electrode;
    forming a second spacer on each first spacer;
    forming a silicide on the source/drain regions;
    forming a local interconnect on a recessed portion of the BOX layer;
    depositing tungsten on each side of the gate electrode up to a height of the one or more silicon fins; and
    forming a via (V0) on the tungsten.

20. The method according to claim 19, wherein the epitaxially grown SiGe forms cladded fins.

* * * * *